(12) United States Patent
Seo et al.

(10) Patent No.: US 11,279,852 B2
(45) Date of Patent: Mar. 22, 2022

(54) CMP SLURRY COMPOSITIONS AND METHODS OF FABRICATING A SEMICONDUCTOR DEVICE USING THE SAME

(71) Applicant: Samsung Electronics Co., Ltd., Suwon-si (KR)

(72) Inventors: Eunsung Seo, Hwaseong-si (KR); Chang Gil Kwon, Anseong-si (KR); Sung Pyo Lee, Anseong-si (KR); Dongchan Kim, Seongnam-si (KR); Bo Yun Kim, Hwaseong-si (KR); Jun Ha Hwang, Anseong-si (KR)

(73) Assignees: Samsung Electronics Co., Ltd.; KCTECH CO., LTD.

( * ) Notice: Subject to any disclaimer, the term of this patent is extended or adjusted under 35 U.S.C. 154(b) by 0 days.

(21) Appl. No.: 16/912,426

(22) Filed: Jun. 25, 2020

(65) Prior Publication Data

US 2021/0130651 A1 May 6, 2021

(30) Foreign Application Priority Data

Oct. 30, 2019 (KR) .......................... 10-2019-0136526

(51) Int. Cl.
| | | |
|---|---|---|
| *C09G 1/18* | (2006.01) |
| *H01L 21/321* | (2006.01) |
| *C09G 1/02* | (2006.01) |
| *H01L 21/306* | (2006.01) |
| *B24B 1/00* | (2006.01) |
| *H01L 21/304* | (2006.01) |
| *C09G 1/00* | (2006.01) |

(52) U.S. Cl.
CPC .................. *C09G 1/18* (2013.01); *B24B 1/00* (2013.01); *C09G 1/00* (2013.01); *C09G 1/02* (2013.01); *H01L 21/304* (2013.01); *H01L 21/30625* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 8,883,031 B2* | 11/2014 | Kanamaru | C09G 1/02 216/89 |
| 2004/0065022 A1* | 4/2004 | Machii | C09G 1/02 51/309 |
| 2016/0108284 A1 | 4/2016 | Yoshizaki | |
| 2019/0371861 A1 | 12/2019 | Kim et al. | |

FOREIGN PATENT DOCUMENTS

| | | |
|---|---|---|
| CN | 110571230 | 12/2019 |
| JP | 2007-154176 | 6/2007 |
| JP | 2008-138273 | 6/2008 |

(Continued)

*Primary Examiner* — Stephanie P Duclair
(74) *Attorney, Agent, or Firm* — Myers Bigel, P.A.

(57) ABSTRACT

Described herein are chemical mechanical polishing (CMP) slurry compositions, such as CMP slurry compositions for polishing an indium tin oxide (ITO) layer, along with methods of fabricating a semiconductor device using such a CMP slurry composition. The CMP slurry composition can include a polishing particle, a dispersing agent, an auxiliary oxidizing agent, and a sugar alcohol compound.

16 Claims, 5 Drawing Sheets

(56) References Cited

FOREIGN PATENT DOCUMENTS

| JP | 5648153 | 1/2015 |
| JP | 2017-190413 | 10/2017 |
| KR | 10-1589309 | 1/2016 |
| KR | 10-2016-0078746 | 7/2016 |
| KR | 10-2019-0138370 | 12/2019 |

* cited by examiner

CMP SLURRY COMPOSITIONS AND METHODS OF FABRICATING A SEMICONDUCTOR DEVICE USING THE SAME

CROSS-REFERENCE TO RELATED APPLICATION

This U.S. non-provisional patent application claims priority under 35 U.S.C. § 119 to Korean Patent Application No. 10-2019-0136526, filed on Oct. 30, 2019, in the Korean Intellectual Property Office, the entire contents of which are hereby incorporated herein by reference.

FIELD

The present disclosure relates to chemical mechanical polishing (CMP) slurry compositions, such as CMP slurry compositions for polishing an indium tin oxide (ITO) layer, and to methods of fabricating a semiconductor device using such compositions.

BACKGROUND OF THE INVENTION

As an integration density of a semiconductor device increases, there is an increasing demand for fine patterns and multi-layered circuitry. To meet such a demand, it is necessary to use layers, whose etch rates are different from each other. One such layer is an indium tin oxide (ITO) layer, which has transparent and conductive properties. The ITO layer is widely used for an electronic device (e.g., an image sensor, an electric mirror, and so forth) requiring a transparent property.

SUMMARY

An embodiment of the inventive concepts provides a CMP slurry composition, which can be used to effectively polish an ITO layer and can have a high polishing rate and/or high polishing selectivity with respect to a polishing stop layer.

An embodiment of the inventive concepts provides a method of fabricating a semiconductor device using a CMP slurry composition.

According to an embodiment of the inventive concepts, a chemical mechanical polishing (CMP) slurry composition for polishing an indium tin oxide (ITO) layer may include a polishing particle, a dispersing agent, an auxiliary oxidizing agent, and a sugar alcohol compound.

According to an embodiment of the inventive concepts, a method of fabricating a semiconductor device may include providing a substrate comprising a polishing stop layer on a lower layer, etching the polishing stop layer and at least a portion of the lower layer to form a trench, forming a transparent electrode layer on the polishing stop layer to fill the trench, and performing a CMP process on the transparent electrode layer using a CM' slurry composition as described herein to expose the polishing stop layer and to form a first transparent electrode in the trench. In some embodiments, the method comprises forming the polishing stop layer on the lower layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structures and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

As used herein, "and/or" refers to and encompasses any and all possible combinations of one or more of the associated listed items, as well as the lack of combinations when interpreted in the alternative ("or").

Figure 1:
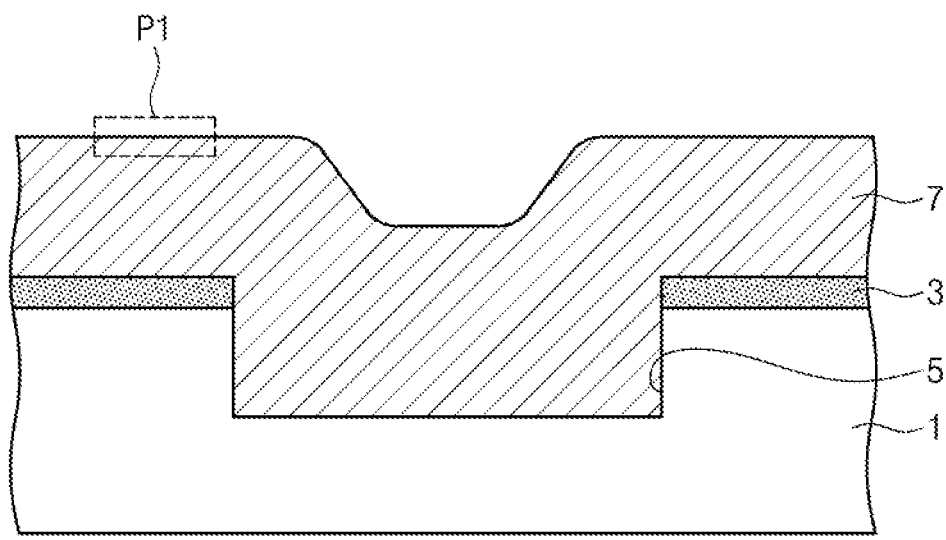
FIGS. 1 and 2 are sectional views illustrating a method of fabricating a semiconductor device according to an embodiment of the inventive concepts.
Figure 2:
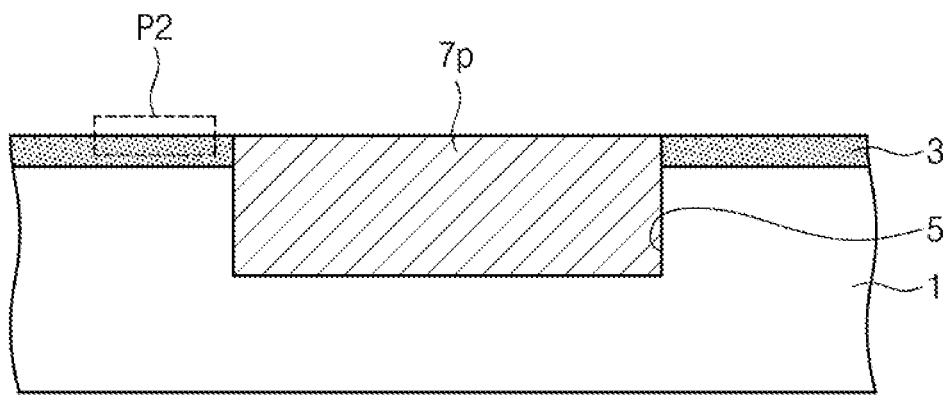
Figure 3:
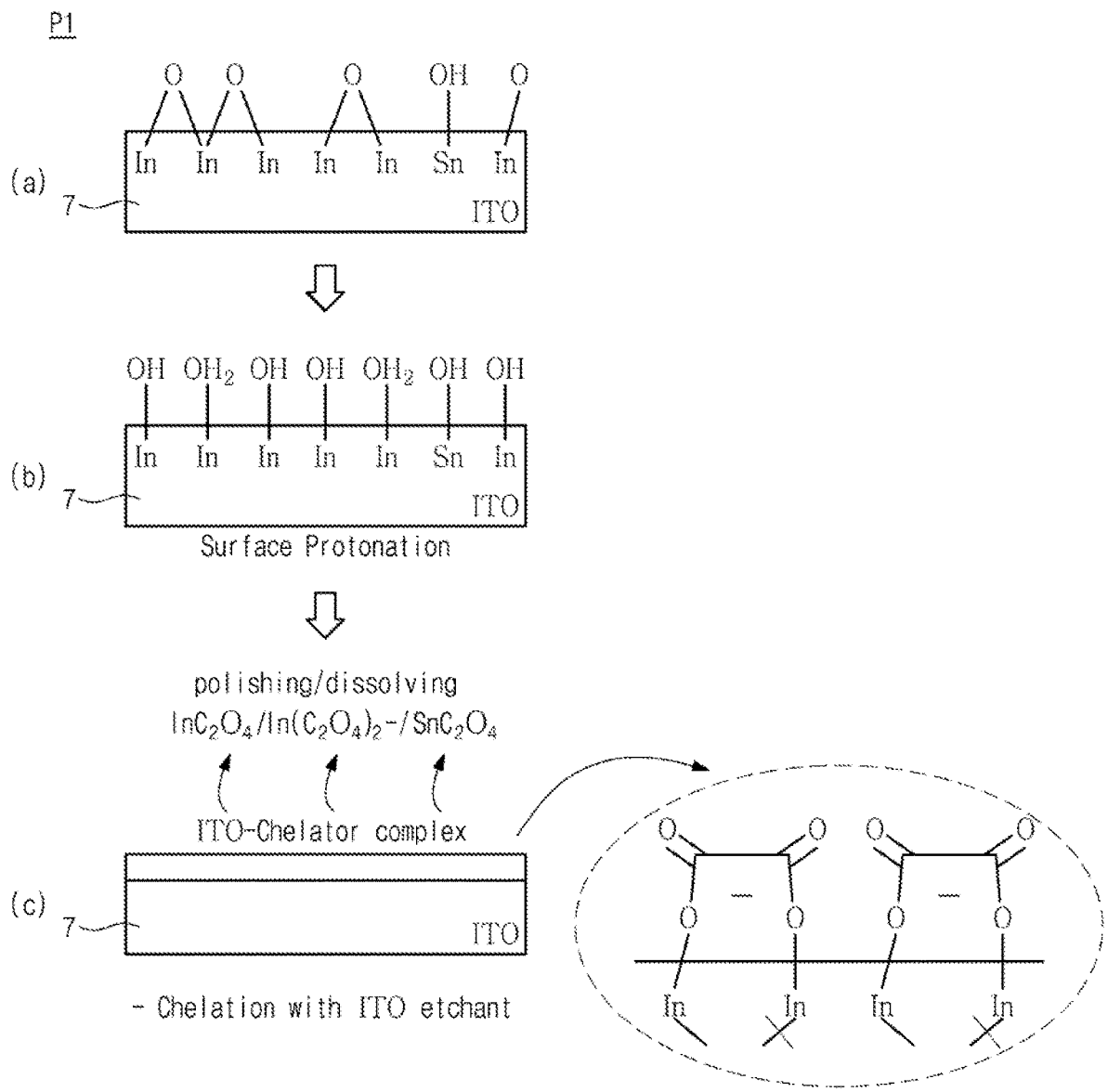
FIG. 3 is a conceptual diagram illustrating a chemical process that may occur at a portion 'P1' of FIG. 1.
Figure 4:
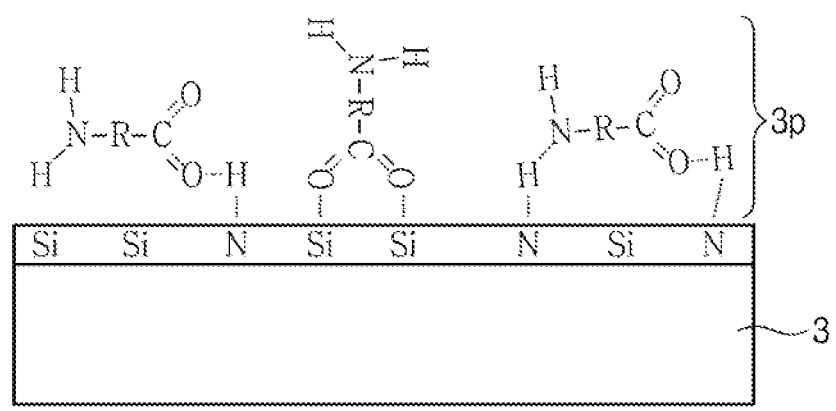
FIG. 4 is a conceptual diagram illustrating a chemical process that may occur at a portion 'P2' of FIG. 2.

FIGS. 1 and 2 are sectional views illustrating a method of fabricating a semiconductor device according to an embodiment of the inventive concepts. FIG. 3 is a conceptual diagram illustrating a chemical process that may occur at a portion 'P1' of FIG. 1. FIG. 4 is a conceptual diagram illustrating a chemical process that may occur at a portion 'P2' of FIG. 2.

Referring to FIG. 1, a lower layer 1 may be provided and/or prepared. The lower layer 1 may be a semiconductor substrate, an interlayered insulating layer, a protection layer, a conductive layer, or an insulating substrate. For example, the lower layer 1 may be formed of and/or comprise silicon, silicon oxide, silicon nitride, silicon oxynitride, poly-silicon, and/or metal-containing materials. A polishing stop layer 3 may be provided and/or formed on the lower layer 1. The polishing stop layer 3 may be formed of and/or comprise a silicon nitride layer, a silicon oxynitride layer, or a silicon oxide layer. In some embodiments, the polishing stop layer 3 may comprise and/or be formed of silicon nitride.

The polishing stop layer 3 and the lower layer 1 may be partially etched to form a trench 5. A transparent electrode layer 7 may be on the lower layer 1 and in the trench 5. In some embodiments, the transparent electrode layer 7 may cover and/or be formed to cover the entire top surface of the lower layer 1 provided with the trench 5. The transparent electrode layer 7 may be formed of and/or comprise an inorganic conductive oxide. For example, the transparent electrode layer 7 may be formed of and/or comprise an indium tin oxide (ITO) layer. The transparent electrode layer 7 may fill the trench 5. The ITO layer may be formed by a deposition process, such as a chemical vapor deposition (CVD) process or an atomic layer deposition (ALD).

A chemical mechanical polishing (CMP) slurry composition according to the inventive concepts may be used to polish an ITO layer. For example, a CMP slurry composition may be used to perform a CMP process on the transparent electrode layer 7. In this case, as shown in FIG. 2, the transparent electrode layer 7 may be removed from the top surface of the polishing stop layer 3, and a transparent electrode 7p may be formed in the trench 5. The CMP slurry composition according to the inventive concepts may include a polishing particle, a dispersing agent, an auxiliary oxidizing agent, and a sugar alcohol compound.

The sugar alcohol compound may be a polyhydric alcohol including two or more hydroxyl groups (—OH). In some embodiments, the sugar alcohol compound may be at least one selected from maltitol, lactitol, threitol, erythritol, ribitol, xylitol, arabitol, adonitol, sorbitol (glucitol), talitol (altritol), mannitol, iditol, allodulcitol, dulcitol, galactitol, sedoheptitol (volemitol), and perseitol. In some embodiments, the sugar alcohol compound may be present in the CMP slurry composition in an amount of 0.1 wt % to 20 wt % relative to the total weight of the composition. In some embodiments, the sugar alcohol compound may be present in the CMP slurry composition in an amount of 0.1 wt % to 5 wt % relative to the total weight of the composition.

In some embodiments, when the amount of the sugar alcohol compound is greater than 20% by weight of the composition, the ITO layer constituting the transparent electrode layer 7 may suffer from a reduction in polishing rate and/or deterioration in dispersion stability and/or when the amount of the sugar alcohol compound is smaller than 0.1% by weight of the composition, polishing selectivity with respect to the silicon nitride layer may be lowered. Thus, it may be important to maintain the content of the sugar alcohol compound within the above range. The sugar alcohol compound may be included in the CMP slurry composition to improve the polishing selectivity with respect to the silicon nitride layer.

The polishing particle may be a metal oxide, a metal oxide coated with an organic or inorganic material, and/or a metal oxide in a colloidal state. In some embodiments, the metal oxide may be at least one selected from silica, ceria, zirconia, alumina, titania, barium titania, germania, mangania, and magnesia. In some embodiments, the polishing particle may be present in the composition in an amount of 0.1 wt % to 10 wt % relative to the total weight of the composition. The polishing particle may have a positively-charged surface. The polishing particle in the composition may be in a colloidal state. The polishing particle may have a size ranging from about 100 nm to about 200 nm.

In some embodiments, the dispersing agent may be at least one selected from benzoic acid, phenylacetic acid, naphthoic acid, mandelic acid, picolinic acid, dipicolinic acid, nicotinic acid, dinicotinic acid, isonicotinic acid, quinolinic acid, anthranilic acid, fusaric acid, phthalic acid, isophthalic acid, terephthalic acid, toluic acid, salicylic acid, nitrobenzoic acid, and pyridinedicarboxylic acid. In some embodiments, the dispersing agent may be present in the composition in an amount of 0.01 wt % to 25 wt % relative to the total weight of the composition. In some embodiments, the dispersing agent may be present in the composition in an amount of 0.01 wt % to 5 wt % relative to the total weight of the composition. An amino acid and/or carboxyl group in the dispersing agent may cause a charge interaction with a positive charge on the surface of the polishing particle, and this may be used to effectively disperse the polishing particles in the composition and/or on a surface.

The auxiliary oxidizing agent may be an organic acid. For example, the auxiliary oxidizing agent may be at least one selected from pimelic acid, malic acid, malonic acid, maleic acid, acetic acid, adipic acid, oxalic acid, succinic acid, tartaric acid, citric acid, lactic acid, glutaric acid, glycollic acid, formic acid, fumaric acid, propionic acid, butyric acid, hydroxybutyric acid, aspartic acid, itaconic acid, tricarballylic acid, suberic acid, sebacic acid, stearic acid, pyruvic acid, acetoacetic acid, glyoxylic acid, azelaic acid, caprylic acid, lauric acid, myristic acid, valeric acid, and palmitic acid. In some embodiments, the auxiliary oxidizing agent may be present in the composition in an amount of 0.001 wt % to 2.5 wt % relative to the total weight of the composition. In some embodiments, the auxiliary oxidizing agent may be present in the composition in an amount of 0.001 wt % to 1.0 wt % relative to the total weight of the composition. In some embodiments, when the amount of the auxiliary oxidizing agent is greater than 1.0% by weight of the composition, the polishing particle may be cohered and a dispersibility thereof may be deteriorated and/or when the amount of the auxiliary oxidizing agent is smaller than 0.001% by weight of the composition, the polishing rate of the ITO layer constituting the transparent electrode layer 7 may be rapidly decreased.

The CMP slurry composition may further include water. In some embodiments, water may be present in the composition in an amount of 42.5 wt % to 99.789 wt % relative to the total weight of the composition. In some embodiments, the CMP slurry composition may have a pH value from 2 to 7. The zeta potential of the CMP slurry composition may range from +5 mV to +70 mV. The electric conductivity of the CMP slurry composition may range from about 300 mS/cm to about 500 mS/cm.

In some embodiments, when a CMP process is performed using a CMP slurry composition of the inventive concepts, reactions illustrated in FIGS. 3 and/or 4 may take place on the surface of the transparent electrode layer 7 (e.g., an ITO layer) and on the surface of the polishing stop layer 3, respectively.

Referring to FIG. 3, surface protonation of a surface of a transparent electrode layer 7 (e.g., a surface of an ITO layer) may occur in which oxygen atoms on the surface (e.g., see (a)) are bonded to hydrogen atoms to form OH groups as shown in (b). As an example, the transparent electrode layer 7 will be referred to as an ITO layer, particularly in reference to FIGS. 3 and 4. This surface protonation may occur due to water present in the CMP slurry composition. A chelation reaction may take place on the surface of the ITO layer by the auxiliary oxidizing agent, which is present in the CMP slurry composition, thereby producing an ITO-chelator complex, as shown in (c), and such a complex may be removed by a CMP process. In a CMP slurry composition according to the inventive concepts, an organic acid having a relatively weak acidity may be used as the auxiliary oxidizing agent; thus, it may be possible to change the ITO layer to an easily-polishable layer by the chelation and/or to prevent the ITO layer from being excessively corroded. Furthermore, due to the polishing particle (e.g., ceria) having a good mechanical property, it may be possible to secure a polishing rate in a process of polishing an ITO layer.

Referring to FIG. 4, if the top surface of the polishing stop layer 3 is exposed by the above polishing process performed on the ITO layer, silicon and/or nitrogen atoms on the surface of the polishing stop layer 3, such as a silicon nitride layer, may be bonded to the hydroxyl group in the sugar alcohol compound through hydrogen bonding, thereby forming on the polishing stop layer 3 a protection layer 3p comprising the sugar alcohol compound. Accordingly, it may be possible to prevent the polishing stop layer 3 from being etched/polished and/or to reduce an etching/polishing rate of the polishing stop layer 3; thus, the polishing stop layer 3 may serve to stop polishing such as to stop polishing at the polishing stop layer 3, and thereby may serve as a stop layer. Owing to this mechanism, the use of a CMP slurry composition according to the inventive concepts may make it possible to prevent and/or suppress the polishing stop layer 3 from being damaged and/or to improve the polishing selectivity in the process of polishing the transparent electrode layer 7 (e.g., ITO layer). Accordingly, it may be possible to improve uniformity in surface roughness and/or a distribution in thickness of layers/patterns left after a CMP process. In some embodiments, a CMP slurry composition according to the inventive concepts may allow a transparent electrode layer 7 (e.g., an ITO layer) to be polished at polishing selectivity from 30:1 to 120:1, with respect to a polishing stop layer 3 such as a silicon oxide layer or a silicon nitride layer (polishing rate of the transparent electrode layer 7 (Å/min):polishing rate of the polishing stop layer 3 (Å/min)).

Experimental examples according to the inventive concepts are described with reference to the following tables.

First, sixteen compositions were prepared for sixteen embodiments 1-16 according to the inventive concepts. In the compositions for embodiments 1-16, sorbitol was used as the sugar alcohol compound, and colloidal ceria was used as the polishing particle. Picolinic acid was used as the dispersing agent. One of oxalic acid, succinic acid, tartaric acid, and glutaric acid was chosen as the auxiliary oxidizing agent. The contents of the compositions for embodiments 1-16 are summarized in Table 1.

TABLE 1

| | wt % of picolinic acid | wt % of oxalic acid | wt % of succinic acid | wt % of tartaric acid | wt % of glutaric acid | wt % of sorbitol | wt % of colloidal ceria |
|---|---|---|---|---|---|---|---|
| Embodiment 1 | 5 | 1 | — | — | — | 5 | 4 |
| Embodiment 2 | 10 | 2 | — | — | — | 5 | 4 |
| Embodiment 3 | 20 | 2 | — | — | — | 5 | 4 |
| Embodiment 4 | 25 | 2 | — | — | — | 5 | 4 |
| Embodiment 5 | 5 | 1 | — | — | — | 10 | 4 |
| Embodiment 6 | 10 | 2 | — | — | — | 10 | 4 |
| Embodiment 7 | 15 | 1 | — | — | — | 10 | 4 |
| Embodiment 8 | 15 | 2 | — | — | — | 10 | 4 |
| Embodiment 9 | 20 | 1 | — | — | — | 10 | 4 |
| Embodiment 10 | 25 | 2.5 | — | — | — | 20 | 4 |
| Embodiment 11 | 25 | — | 1 | — | — | 10 | 4 |
| Embodiment 12 | 25 | — | 2 | — | — | 10 | 4 |
| Embodiment 13 | 25 | — | — | 1 | — | 10 | 4 |
| Embodiment 14 | 25 | — | — | 2 | — | 10 | 4 |
| Embodiment 15 | 25 | — | — | — | 1 | 10 | 4 |
| Embodiment 16 | 25 | — | — | — | 2 | 10 | 4 |

Four compositions were prepared for additional embodiments 17-20 according to the inventive concepts. In the compositions for embodiments 17-20, xylitol or threitol was used as the sugar alcohol compound, and colloidal ceria was used as the polishing particle. Picolinic acid was used as the dispersing agent. Oxalic acid was used as the auxiliary oxidizing agent. The contents of the compositions for embodiments 17-20 are summarized in Table 2.

TABLE 2

| | wt % of picolinic acid | wt % of oxalic acid | wt % of glutaric acid | wt % of sorbitol | wt % of colloidal ceria |
|---|---|---|---|---|---|
| Embodiment 17 | 10 | 2 | 10 | — | 4 |
| Embodiment 18 | 15 | 2 | 10 | — | 4 |
| Embodiment 19 | 10 | 2 | — | 10 | 4 |
| Embodiment 20 | 15 | 2 | — | 10 | 4 |

Next, four compositions were prepared for comparative embodiments 1-4. A sugar alcohol compound was not included in the compositions for comparative embodiments 1-4. Colloidal ceria was used as the polishing particle. Picolinic acid was used as the dispersing agent. Oxalic acid was used as the auxiliary oxidizing agent. The contents of the compositions for comparative embodiments 1-4 are summarized in Table 3.

TABLE 3

| | wt % of picolinic acid | wt % of oxalic acid | wt % of colloidal ceria |
|---|---|---|---|
| Comparative Embodiment 1 | 5 | 1 | 4 |
| Comparative Embodiment 2 | 10 | 2 | 4 |
| Comparative Embodiment 3 | 20 | 2 | 4 |
| Comparative Embodiment 4 | 25 | 2 | 4 |

All of the compositions for embodiments 1 to 20 and comparative embodiments 1 to 4 summarized in Tables 1 to 3 had the same pH value of about 3.3. After the compositions were prepared, first wafers and second wafers were prepared. Each of the first wafers was fabricated to have only an ITO layer on a bare silicon wafer. Each of the second wafers was fabricated to have only a silicon nitride layer on a bare silicon wafer. Thereafter, a CMP process was performed on each of the first and second wafers using the compositions for the embodiments and the comparative embodiments, and Table 4 shows polishing rate data (per minute) obtained for each embodiment.

TABLE 4

| | ITO (Å/min) | SiN (Å/min) | Selectivity (ITO/SiN) |
|---|---|---|---|
| Embodiment 1 | 2514 | 31 | 81 |
| Embodiment 2 | 3014 | 38 | 79 |
| Embodiment 3 | 3354 | 41 | 82 |
| Embodiment 4 | 3217 | 40 | 80 |
| Embodiment 5 | 1715 | 23 | 75 |
| Embodiment 6 | 3017 | 35 | 86 |
| Embodiment 7 | 2879 | 26 | 111 |
| Embodiment 8 | 3295 | 34 | 97 |
| Embodiment 9 | 2917 | 31 | 94 |
| Embodiment 10 | 3401 | 41 | 83 |
| Embodiment 11 | 1815 | 35 | 52 |
| Embodiment 12 | 2145 | 41 | 52 |
| Embodiment 13 | 1713 | 32 | 54 |
| Embodiment 14 | 1947 | 42 | 46 |
| Embodiment 15 | 1517 | 41 | 37 |
| Embodiment 16 | 1764 | 50 | 35 |
| Embodiment 17 | 3185 | 67 | 48 |
| Embodiment 18 | 3218 | 61 | 53 |

TABLE 4-continued

| | ITO (Å/min) | SiN (Å/min) | Selectivity (ITO/SiN) |
|---|---|---|---|
| Embodiment 19 | 3287 | 71 | 46 |
| Embodiment 20 | 3287 | 69 | 48 |
| Comparative Embodiment 1 | 2621 | 109 | 24 |
| Comparative Embodiment 2 | 3115 | 120 | 26 |
| Comparative Embodiment 3 | 3481 | 127 | 27 |
| Comparative Embodiment 4 | 3005 | 118 | 25 |

Table 4 shows that there was no significant difference in the polishing rate of the ITO layer between the comparative embodiments 1-4 and embodiments 1-20. However, the silicon nitride layers in the comparative embodiments 1-4 were polished at very high rates of 109 Å/min to 127 Å/min, whereas the silicon nitride layers in embodiments 1-20 were polished at relatively slow rates of 23 Å/min to 69 Å/min. As a result, the polishing selectivity (polishing rate of the ITO layer (Å/min):polishing rate of the silicon nitride layer (Å/min)) was from 24 to 25 for comparative embodiments 1-4 and was from 35 to 111 for embodiments 1-20 in which the CMP slurry compositions comprising the sugar alcohol compound were used. This shows that it is possible to polish the ITO layer at a faster polishing rate and at a higher polishing selectivity when the CMP slurry compositions containing the sugar alcohol compound according to embodiments 1-20 were used than when the compositions according to comparative embodiments 1-4 were used.

The following is a description of how a polishing rate of an ITO layer is changed by a content of ceria in the compositions according to the inventive concepts. First, seven compositions were prepared for embodiments 21-27 according to the inventive concepts. In the compositions for embodiments 21-27, sorbitol was used as the sugar alcohol compound, and colloidal ceria was used as the polishing particle. Picolinic acid was used as the dispersing agent. Oxalic acid was used as the auxiliary oxidizing agent. The contents of the compositions for embodiments 21-27 are summarized in Table 5. A CMP process was performed on an ITO layer formed on a bare silicon wafer, separately using each of seven compositions of embodiments 21-27, and polishing rate data (per minute) of the ITO layer was obtained for each embodiment and is described in Table 5.

TABLE 5

| | wt % | | | | | Material characteristics | | |
|---|---|---|---|---|---|---|---|---|
| | Colloidal ceria | Picolinic acid | Oxalic acid | sorbitol | pH | Electric conductivity (mS/cm) | Particle size of colloidal ceria (nm) | ITO polishing rate (Å/min) |
| Embodiment 21 | 4 | 15 | 1.5 | 10 | 3.33 | 373 | 141 | 2834 |
| Embodiment 22 | 2 | 15 | 1.5 | 10 | 3.33 | 401 | 142 | 3154 |
| Embodiment 23 | 1 | 15 | 1.5 | 10 | 3.31 | 436.3 | 141 | 3327 |
| Embodiment 24 | 0.7 | 15 | 1.5 | 10 | 3.29 | 438.4 | 143 | 3011 |
| Embodiment 25 | 0.4 | 15 | 1.5 | 10 | 3.29 | 449 | 143 | 2211 |
| Embodiment 26 | 0.2 | 15 | 1.5 | 10 | 3.21 | 446.3 | 141 | 1403 |
| Embodiment 27 | 0.1 | 15 | 1.5 | 10 | 3.22 | 447.2 | 142 | 778 |

As shown in Table 5, the concentrations of the picolinic acid, oxalic acid, and sorbitol were fixed to 15 wt %, 1.5 wt %, and 10 wt %, whereas the concentration of the colloidal ceria was changed from 0.1 wt % to 4 wt %. The compositions for embodiments 21-27 had a substantially constant pH value (e.g., 3.21 to 3.33). The compositions for embodiments 21-27 had an electric conductivity ranging from about 373 mS/cm to 449 mS/cm. In the compositions for embodiments 21-27, the ceria particle had a substantially constant size ranging from 141 nm to 143 nm. Table 5 shows that by using the compositions for the embodiments 21-27, it is possible to polish the ITO layer at a fast polishing rate of 778 Å/min or faster.

In general, it is difficult to polish or etch the ITO layer, due to its hard property. However, in the case where a CMP slurry composition according to the inventive concepts is used to perform a CMP process on an ITO layer, it may be possible to polish the ITO layer at a fast polishing rate and at a high polishing selectivity.

A CMP slurry composition according to the inventive concepts may be used for a CMP process, which is performed not only on the ITO layer but also on other inorganic conductive oxide layers.

The methods, processes, and/or compositions described with reference to FIGS. 1 to 4 may be used to fabricate a semiconductor device (e.g., an image sensor), a display substrate, or a display panel.

The description that follows will refer to an example, in which a composition according to the inventive concepts is used for a process of fabricating an image sensor that is an example of a semiconductor device.

Figure 5:
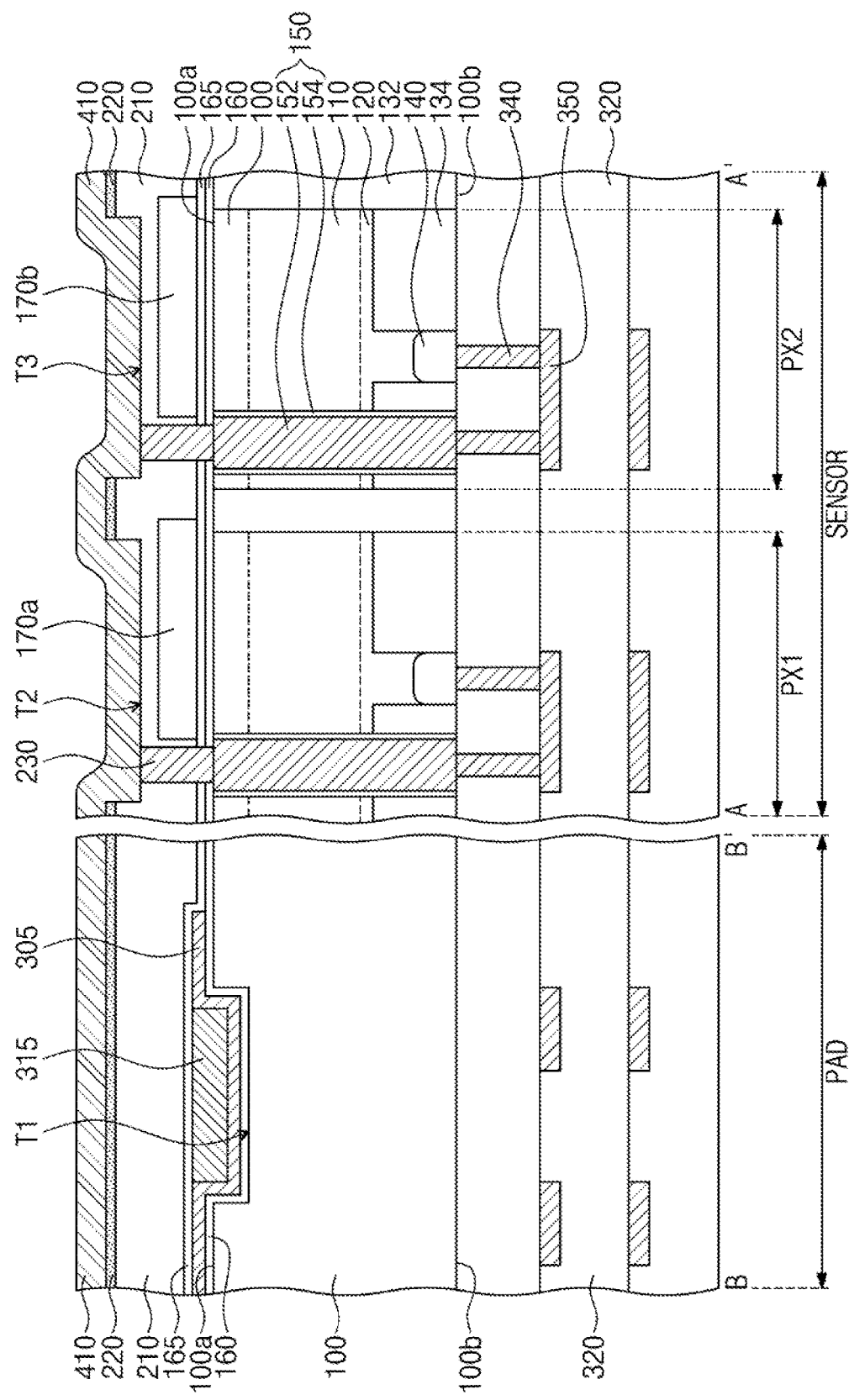
FIGS. 5 and 6 are sectional views illustrating a process of fabricating an image sensor according to an embodiment of the inventive concepts.
Figure 6:
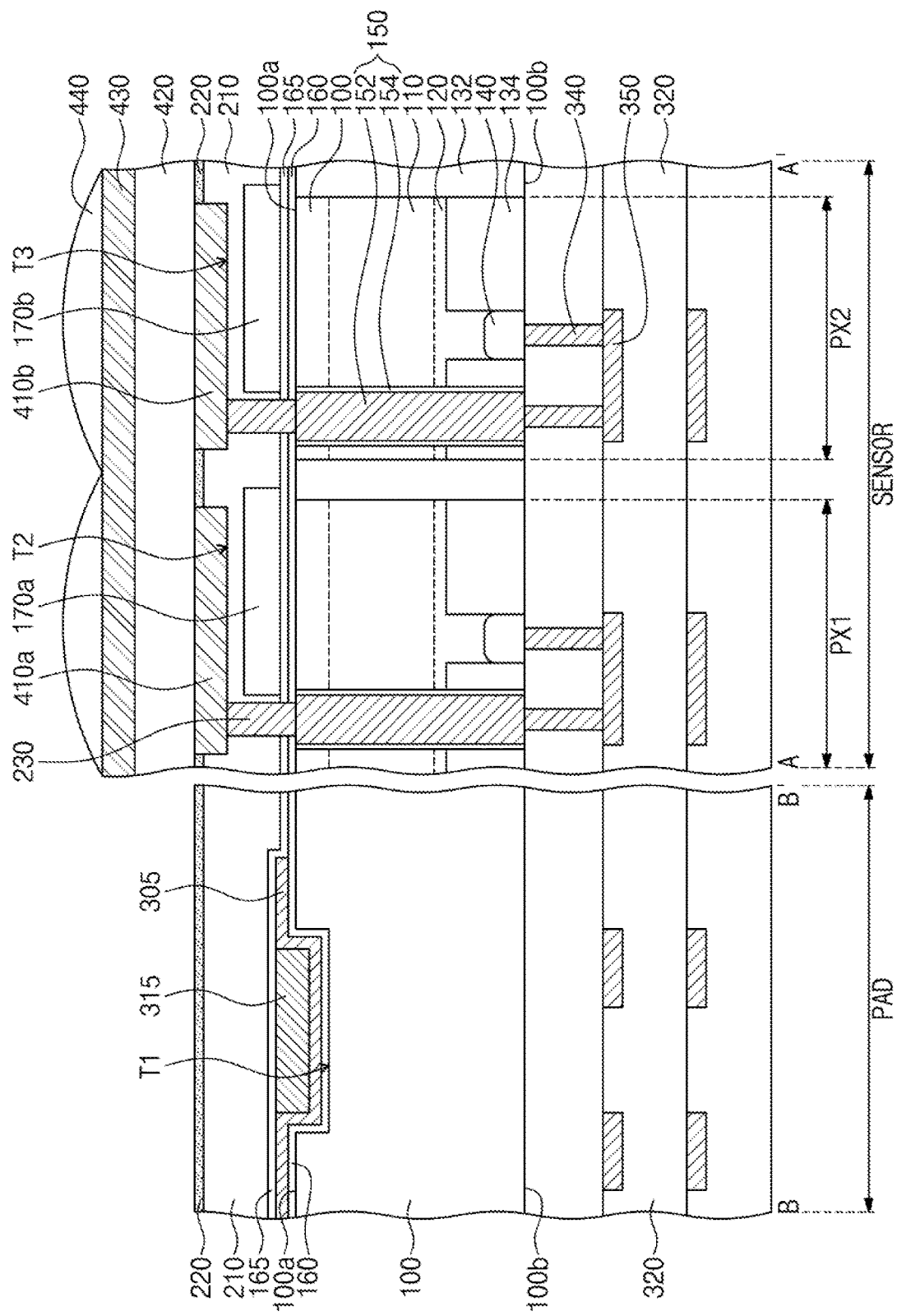

FIGS. 5 and 6 are sectional views illustrating a process of fabricating an image sensor according to an embodiment of the inventive concepts.

Referring to FIG. 5, a substrate 100 including a sensor region SENSOR and a pad region PAD may be provided. The sensor region SENSOR may include a plurality of pixels PX1 and PX2. The substrate 100 may include a first surface 100a and a second surface 100b facing each other. The substrate 100 may be doped with impurities to have a first conductivity type. A photoelectric conversion part 110 may be formed by doping a portion of the substrate 100 with impurities, which are of a second conductivity type different from the first conductivity type. The photoelectric conversion part 110 may be formed to be closer to the first surface 100a than to the second surface 100b. A well region 120 may be formed by doping a portion of the substrate 100 with impurities of the first conductivity type. The well region 120 may be formed adjacent to the second surface 100b.

A shallow device isolation part 134 may be formed in the substrate 100 and adjacent to the second surface 100b. The shallow device isolation part 134 may be an impurity region, which is doped with impurities of the first conductivity type, or may be an insulating pattern, which is formed by a shallow trench isolation (STI) process. In the case where the shallow device isolation part 134 is the impurity region, a concentration of the impurities of the first conductivity type may be higher in the shallow device isolation part 134 than in the substrate 100. In addition, a storage node region 140 may be formed in the substrate 100 and adjacent to the second surface 100b. The storage node region 140 may be in contact with the shallow device isolation part 134. The storage node region 140 may be doped with impurities of the second conductivity type and may be spaced apart from the photoelectric conversion part 110 by the well region 120.

A deep device isolation part 132 may be provided to penetrate the substrate 100. The deep device isolation part 132 may include a material whose refractive index is different than that of the substrate 100. The deep device isolation part 132 may be formed of and/or comprise one or more of silicon oxide, aluminum oxide, and hafnium oxide. The deep device isolation part 132 may be provided to have an air gap region. The deep device isolation part 132 may further include a polysilicon and/or conductive pattern, which is electrically disconnected from the substrate 100. The deep device isolation part 132 may be provided to have a mesh shape, when viewed in a plan view.

Although not shown, various transistors, such as transfer, reset, source follower, and selection transistors, may be formed on the second surface 100b of the substrate 100. Interlayered insulating layers 320 may be stacked on the second surface 100b of the substrate 100. Contact plugs 340 and interconnection lines 350 may be formed in the interlayered insulating layers 320.

In each of the pixels PX1 and PX2 on the sensor region SENSOR, a penetration electrode structure 150 may be formed to penetrate the substrate 100, and the penetration electrode structure 150 may be electrically connected to the storage node region 140. The penetration electrode structure 150 may include a penetration electrode 152 and a penetration electrode insulating layer 154, which is provided to enclose the penetration electrode 152.

A portion of the first surface 100a of the substrate 100 on the pad region PAD may be etched to form a first trench T1. A fixed charge layer 160 may be formed on the first surface 100a of the substrate 100. The fixed charge layer 160 may be formed of and/or comprise one or more metal oxide(s), such as hafnium oxide and aluminum oxide. A back-side interconnection layer 305 may be formed on the pad region PAD. The back-side interconnection layer 305 may be formed through depositing and etching processes. The back-side interconnection layer 305 may be formed of and/or comprise a material containing a metal (e.g., titanium, tungsten, and aluminum). Although not shown, when the back-side interconnection layer 305 is formed, a light-blocking pattern may be formed on the sensor region SENSOR to cover the first surface 100a of the substrate 100. The light-blocking pattern may be overlapped with the deep device isolation part 132 and may have a mesh shape, when viewed in a plan view.

A conductive pad 315 may be formed in the first trench T1 by, for example, depositing and etching processes. The conductive pad 315 may be in contact with the back-side interconnection layer 305. The conductive pad 315 may contain a metallic element (e.g., tungsten, copper, and aluminum). After the formation of the conductive pad 315, an anti-reflection layer 165 may be formed on the first surface 100a of the substrate 100. The anti-reflection layer 165 may be formed of and/or comprise silicon nitride.

Optical filters 170a and 170b may be formed on the anti-reflection layer 165, and in some embodiments, each of the optical filters 170a and 170b may be formed on a corresponding one of the pixels PX1 and PX2 and on the sensor region SENSOR. Each of the optical filters 170a and 170b may be a color filter (e.g., of red, blue, or green) or an infrared filter. At least one of the optical filters 170a and 170b may be transparent. The optical filters 170a and 170b may be formed of and/or comprise photoresist patterns containing pigment.

After the formation of the optical filters 170a and 170b, a back-side insulating layer 210 may be formed on the first surface 100a of the substrate 100. The back-side insulating layer 210 may be formed of and/or comprise, for example, silicon oxide. A polishing stop layer 220 may be formed on the back-side insulating layer 210. The polishing stop layer 220 may be formed of and/or comprise, for example, silicon nitride.

The polishing stop layer 220 and the back-side insulating layer 210 on the sensor region SENSOR may be patterned to form a contact hole exposing the penetration electrode 152, and then, a lower contact plug 230 may be formed by filling the contact hole with a conductive layer.

The polishing stop layer 220 and the back-side insulating layer 210 may be etched to form a second trench T2 and a third trench T3 on the sensor region SENSOR. Here, a portion of the lower contact plug 230 may be removed. A top surface of the lower contact plug 230 may be exposed through the second and third trenches T2 and T3. The second trench T2 may include in the first pixel PX1, and the third trench T3 may be formed in the second pixel PX2. The second and third trenches T2 and T3 may not expose the optical filters 170a and 170b.

After the formation of the second and third trenches T2 and T3, a transparent electrode layer 410 may be formed on the first surface 100a of the substrate 100. The transparent electrode layer 410 may be formed of and/or comprise an inorganic conductive oxide. For example, the transparent electrode layer 410 may be formed of and/or comprise indium tin oxide (ITO). The transparent electrode layer 410 may be formed by a deposition process (e.g., CVD and/or ALD). The transparent electrode layer 410 may be formed to fill the second and third trenches T2 and T3.

Referring to FIG. 6, a CMP process may be performed on the transparent electrode layer 410 to expose the top surface of the polishing stop layer 220 and to form transparent pixel electrodes 410a and 410b in the second and third trenches T2 and T3, respectively, and in some embodiments, the CMP process may be performed using a CMP slurry composition according to the inventive concepts such as described with reference to FIGS. 1 to 4. The transparent pixel electrodes 410a and 410b may include a first transparent pixel electrode 410a in the second trench T2 and a second transparent pixel electrode 410b in the third trench T3. Here, the top surface of the polishing stop layer 220 may be exposed, on the pad region PAD.

Next, an organic photoelectric conversion layer 420 and a transparent common electrode 430 may be sequentially formed on the transparent pixel electrodes 410a and 410b and on the sensor region SENSOR, and a micro lens array 440 may be formed on the transparent common electrode 430 to fabricate an image sensor. The transparent common electrode 430 may also be formed of and/or comprise an ITO layer. The organic photoelectric conversion layer 420 may include one or more organic material(s) of at least two different optical band gaps. The organic photoelectric conversion layer 420 may include a material, in which one or more kinds of polymers, oligomers, and/or polymer composites are included solely or in a mixed state. In some embodiments, the organic photoelectric conversion layer 420 may be formed of and/or comprise a mixture of donor/acceptor polymers or at least one of n- and p-type organic semiconductor materials. In some embodiments, the organic photoelectric conversion layer 420 may include quantum dots or superfine particles, which have at least two different optical band gaps.

In some embodiments, when a CMP slurry composition according to the inventive concepts is used to polish an ITO layer, the transparent pixel electrodes 410a and 410b may be formed by the CMP process with high polishing selectivity. Thus, a residue of the ITO layer constituting the transparent electrode layer 410 may be prevented from being left on the pad region PAD. Furthermore, it may be possible to easily control the CMP process, to reduce a process time of a polishing process, and/or to improve a unit-per-equipment-hour (UPEH) property in the equipment for the CMP process compared to a CMP process that does not utilize a CMP slurry composition according to the inventive concepts. In addition, it may be possible to improve a variation in film quality of a layer to be polished, and this may make it possible to prevent the conductive pad 315 from being exposed by the CMP process.

If a CMP slurry composition is improperly used for the CMP process, a residue of the ITO layer constituting the transparent electrode layer 410 may be left on the pad region PAD, and in this case, a not-open issue may occur in a subsequent PAD open process. To avoid this issue, the transparent electrode layer 410 (e.g., the ITO layer) of the pad region PAD may be removed in advance, but in this case, an additional photolithography process may be needed to form a mask. That is, a fabrication process may be complex and may suffer from low productivity. By contrast, according to some embodiments of the inventive concepts, since a CMP slurry composition with high polishing selectivity can be used to polish an ITO layer, it may be possible to avoid these issues and to simplify the fabrication process.

According to some embodiments of the inventive concepts, a CMP slurry composition for polishing an ITO layer may include a polishing particle, a dispersing agent, an auxiliary oxidizing agent, and a sugar alcohol compound. By using the CMP slurry composition, an ITO layer may be polished at polishing selectivity of 30:1 to 120:1 with respect to a silicon oxide layer (polishing rate of the ITO layer (Å/min):polishing rate of the silicon oxide layer (Å/min)) or with respect to a silicon nitride layer (polishing rate of the ITO layer (Å/min):polishing rate of the silicon nitride layer (Å/min)). In addition, in the case where the CMP slurry composition is used to fabricate a semiconductor device, it may be possible to simplify a fabrication process and/or to reduce a process failure.

While example embodiments of the inventive concepts have been particularly shown and described, it will be understood by one of ordinary skill in the art that variations in form and detail may be made therein without departing from the spirit and scope of the attached claims.

What is claimed is:

1. A chemical mechanical polishing (CMP) slurry composition for polishing an indium tin oxide (ITO) layer, the CMP slurry composition comprising:
   a polishing particle;
   a dispersing agent;
   an auxiliary oxidizing agent; and
   a sugar alcohol compound,
   wherein the polishing particle is ceria that has a positively-charged surface and is in a colloidal state, and
   wherein the dispersing agent is one or more selected from the group consisting of dipicolinic acid, dinicotinic acid, anthranilic acid, fusaric acid, and nitrobenzoic acid.

2. The CMP slurry composition of claim 1, wherein the polishing particle is present in the composition in an amount from 0.1% to 10% by weight of the composition,
   the dispersing agent is present in the composition in an amount from 0.01% to 25% by weight of the composition,
   the auxiliary oxidizing agent is present in the composition in an amount from 0.001% to 2.5% by weight of the composition, and
   the sugar alcohol compound is present in the composition in an amount from 0.1% to 20% by weight of the composition.

3. The CMP slurry composition of claim 1, wherein the sugar alcohol compound is one or more selected from the group consisting of maltitol, lactitol, threitol, erythritol, ribitol, xylitol, arabitol, adonitol, sorbitol, talitol, mannitol, iditol, allodulcitol, dulcitol, galactitol, sedoheptitol, and perseitol.

4. The CMP slurry composition of claim 1, wherein the CMP slurry composition has a pH from 2 to 7.

5. The CMP slurry composition of claim 1, wherein the CMP slurry composition has a zeta potential from +5 mV to +70 mV.

6. The CMP slurry composition of claim 1, wherein the auxiliary oxidizing agent is one or more selected from the group consisting of pimelic acid, malic acid, malonic acid, maleic acid, acetic acid, adipic acid, oxalic acid, succinic acid, tartaric acid, citric acid, lactic acid, glutaric acid, glycollic acid, formic acid, fumaric acid, propionic acid, butyric acid, hydroxybutyric acid, aspartic acid, itaconic acid, tricarballylic acid, suberic acid, sebacic acid, stearic acid, pyruvic acid, acetoacetic acid, glyoxylic acid, azelaic acid, caprylic acid, lauric acid, myristic acid, valeric acid, and palmitic acid.

7. The CMP slurry composition of claim 1, wherein the CMP slurry composition polishes an indium tin oxide (ITO) layer at a polishing selectivity relative to a silicon oxide layer or a silicon nitride layer of 30:1 to 120:1 (polishing rate of the ITO layer (Å/min):polishing rate of the silicon oxide or silicon nitride layer (Å/min)).

8. The CMP slurry composition of claim 1, further comprising water.

9. A method of fabricating a semiconductor device, comprising:
provided a substrate comprising a polishing stop layer on a lower layer;
etching the polishing stop layer and at least a portion of the lower layer to form a trench;
forming a transparent electrode layer on the polishing stop layer to fill the trench; and
performing a CMP process on the transparent electrode layer using the CMP slurry composition of claim 1 to expose the polishing stop layer and to form a first transparent electrode in the trench.

10. The method of claim 9, further comprising, prior to providing the substrate, forming an optical filter on the substrate, and
forming the lower layer on the optical filter, and
wherein the trench does not expose the optical filter.

11. The method of claim 10, further comprising, prior to forming the optical filter, forming a photoelectric conversion part in the substrate.

12. The method of claim 10, wherein the substrate further comprises a pad region and a sensor region,
and the method further comprises forming the optical filter on the sensor region of the substrate, and, prior to forming the optical filter, forming a conductive pad on the pad region of the substrate,
wherein the lower layer and the polishing stop layer cover the conductive pad, and
the polishing stop layer is exposed on the pad region, after performing the CMP process.

13. The method of claim 9, further comprising, prior to forming of the transparent electrode layer, forming a conductive plug in the lower layer,
wherein a top surface of the conductive plug is exposed through the trench.

14. The method of claim 9, wherein the polishing stop layer is a silicon nitride layer.

15. The method of claim 9, wherein the transparent electrode layer is an indium tin oxide (ITO) layer.

16. The method of claim 9, further comprising:
forming an organic photoelectric conversion layer on the first transparent electrode; and
forming a second transparent electrode on the organic photoelectric conversion layer.

* * * * *